United States Patent [19]
Tien et al.

[11] Patent Number: 5,672,241
[45] Date of Patent: Sep. 30, 1997

[54] METHOD OF FORMING METAL CONTACT HOLES IN SEMICONDUCTOR FABRICATION

[75] Inventors: Yu-Chung Tien, Touliu; Chieh-Lin Huang, Hsinchu, both of Taiwan

[73] Assignee: Winbond Electronics Corporation, Taiwan

[21] Appl. No.: 662,137

[22] Filed: Jun. 12, 1996

[51] Int. Cl.[6] .............................. H01L 21/768
[52] U.S. Cl. .................. 156/643.1; 156/644.1; 156/651.1; 156/657.1; 437/189; 437/195; 437/981
[58] Field of Search ............ 156/643.1, 644.1, 156/651.1, 657.1; 437/981, 189, 95

[56] References Cited

U.S. PATENT DOCUMENTS

| | | | |
|---|---|---|---|
| 4,902,377 | 2/1990 | Berglund et al. | 156/643 |
| 5,180,689 | 1/1993 | Liu et al. | 437/228 |
| 5,219,791 | 6/1993 | Freiberger | 437/195 |
| 5,552,343 | 9/1996 | Hsu | 437/195 |

FOREIGN PATENT DOCUMENTS 8-191103  7/1996  Japan ............................ 21/90

*Primary Examiner*—R. Bruce Breneman
*Assistant Examiner*—Julie E. Stein
*Attorney, Agent, or Firm*—Rabin, Champagne & Lynt, P.C.

[57] ABSTRACT

A method of forming metal contact holes during semiconductor fabrication. The method includes three major steps to form the metal contact holes; a wet isotropic etching process for forming a first recess portion, a dry isotropic etching process for extending the first recess portion into a second recess portion, and a dry anisotropic etching process for forming a third recess portion beneath the second recess portion. The second recess portion and the third recess portion in combination constitute the metal contact hole. The lateral extent of the second recess portion, which in part affects subsequent deposition of metal in the contact hole and thus the step coverage effect of the metal connection, can be controlled by limiting the time of the dry isotropic etching process.

8 Claims, 5 Drawing Sheets

METHOD OF FORMING METAL CONTACT HOLES IN SEMICONDUCTOR FABRICATION

BACKGROUND OF THE INVENTION

1. Field of the Invention

The invention relates to semiconductor fabrication processes, and more particularly, to a method for forming contact holes having an improved profile that allows better step coverage for sputtering of metal in the contact holes.

2. Description of Background Art

With advances in submicron semiconductor fabrication technology, the feature size of semiconductor components in integrated circuits (ICs) has been reduced to a level below one micrometer (1 μm). Such a smaller feature size causes difficulty in fabricating ICs. For instance, when metal contact holes are formed through dielectric layers to provide interconnections between transistors and conductive wires in an IC having a feature size at the submicron level, the subsequent sputtering process for depositing metal into the metal contact hole is extremely difficult to perform. Accordingly, the semiconductor industry is conducting research to develop methods that would allow the metal to be much more easily deposited into the metal contact holes.

A prerequisite for the metal to be more easily deposited into the metal contact holes is the formation of metal contact holes having a profile that allows good step coverage of the metal being deposited on the wafer.

FIGS. 1A–1D are sectional schematic views depicting the steps involved in a conventional method for forming a metal contact hole during semiconductor fabrication. Referring first to FIG. 1A, there is shown a wafer that has been fabricated up to the stage previous to the formation of a metal contact hole. The wafer in this stage includes a silicon substrate 10 having a plurality of $n^+$-type source/drain regions, a polysilicon layer 21, and oxide layers 31, 32, 33. The polysilicon layer 21 serves as the gate of a transistor in the wafer, and the oxide layers 31, 32, 33 are each formed by conducting a low temperature oxide reaction (LTO) process, or through the use of a dielectric material such as tetra-ethyl-ortho-silicate (TEOS) or borophosphosilicate glass (BPSG). Processes for forming the polysilicon layer 21 and the oxide layers 31, 32, 33 are all conventional techniques, so that a detailed description thereof will not be provided in this specification.

Referring next to FIG. 1B, next, preliminary to providing the metal contact hole, a photoresist layer 40 is first coated over the oxide layer 33. A mask process and a photolithographic process are then carried out on the wafer so as to form an opening 41 at a position above where the metal contact hole is to be formed.

Referring to FIG. 1C, in the subsequent step a wet isotropic etching process is conducted on the oxide layer 33 through the opening 41 so as to remove an unwanted part of the oxide layer 33, thereby forming an upper recess portion 51 which is substantially conical in shape. Since the wet etching process is isotropic, meaning that the etching proceeds outward in all directions, the upper recess portion 51 includes an undercut portion beneath the photoresist layer 40 near the opening 41.

Referring to FIG. 1D, subsequent to the wet isotropic etching process, a dry anisotropic etching process is conducted on the oxide layers 31, 32, 33 through the opening 41 so as to remove further unwanted parts of the oxide layers 31, 32, 33. As a result there is formed a bottom recess portion 52 which is shaped substantially like an upright cylindrical colunto. Since the dry etching process is anisotropic, meaning that the etching proceeds in only one direction (here, the downward direction), the sidewall of the bottom recess portion 52 has a substantially upright profile. Next, the photoresist layer 40 is removed. The upper recess portion 51 and the bottom recess portion 52 in combination constitute the desired metal contact hole.

A drawback to the foregoing method, however, is that the wet etching process is an isotropic process, in which the rate of etching in the lateral direction with respect to the rate of etching in the downward direction is not easy to control. Thus, the upper recess portion 51 of the metal contact hole exhibits a sloped profile which causes the metal later deposited in the metal contact hole to have a poor step coverage effect.

SUMMARY OF THE INVENTION

It is therefore an object of the invention to provide a method for forming metal contact holes during semiconductor fabrication that allows the metal contact holes thus formed to have an improved profile that allows the ensuing metal deposited in the metal contact holes to provide a better step coverage effect.

It is another object of the invention to provide a method for forming metal contact holes during semiconductor fabrication that allows the etching rate in the lateral direction and the etching rate in the downward direction to be easily controlled.

In accordance with the foregoing and other objects of the invention, a new and improved method for forming metal contact holes in semiconductor fabrication is provided. According to the method, the first step is to coat a photoresist layer over the dielectric layer and then form an opening in the photoresist layer at a position over where the metal contact hole is to be formed. The second step is to conduct a wet isotropic etching process through the opening, so as to form a first recess portion in the dielectric layer. The third step is to conduct a dry isotropic etching process through the opening, so as to extend the first recess portion in order to form a second recess portion. The fourth step is to conduct a dry anisotropic etching process through the opening so as to form a third recess portion beneath the second recess portion. The second recess portion and the third recess portion, in combination, constitute the desired metal contact hole. Finally, the fifth step is to remove the photoresist layer.

Through the foregoing method, the second recess portion, which is an upper part of the metal contact hole, has a more improved profile that allows improved step coverage effect relative to the conventional method. As a result, the integrated circuit thus fabricated has better reliability and a longer useful life.

BRIEF DESCRIPTION OF DRAWINGS

The invention can be more fully understood by reading the subsequent detailed description of the preferred embodiment, with reference to the accompanying drawings, wherein.

DETAILED DESCRIPTION OF THE PREFERRED EMBODIMENT

Figure 1A:
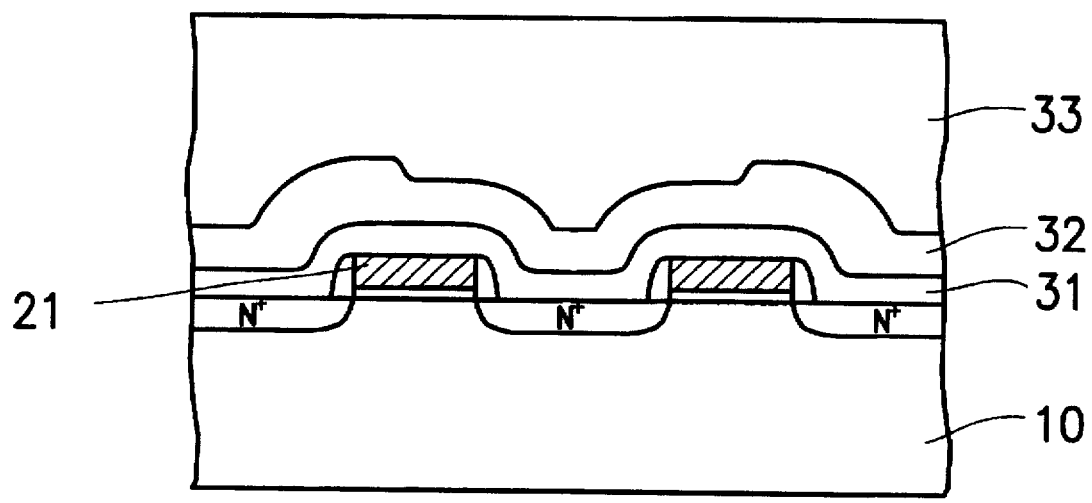
FIGS. 1A–1D are sectional schematic views depicting the steps involved in a conventional method for forming a metal contact hole during semiconductor fabrication.
Figure 1B:
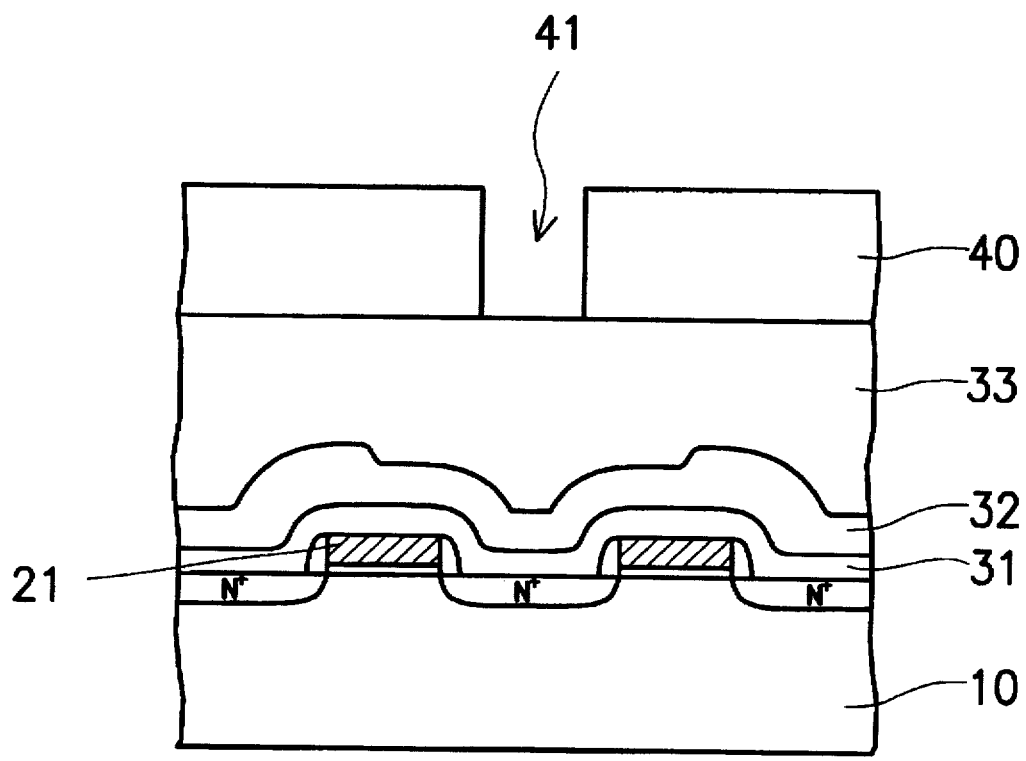
Figure 2A:
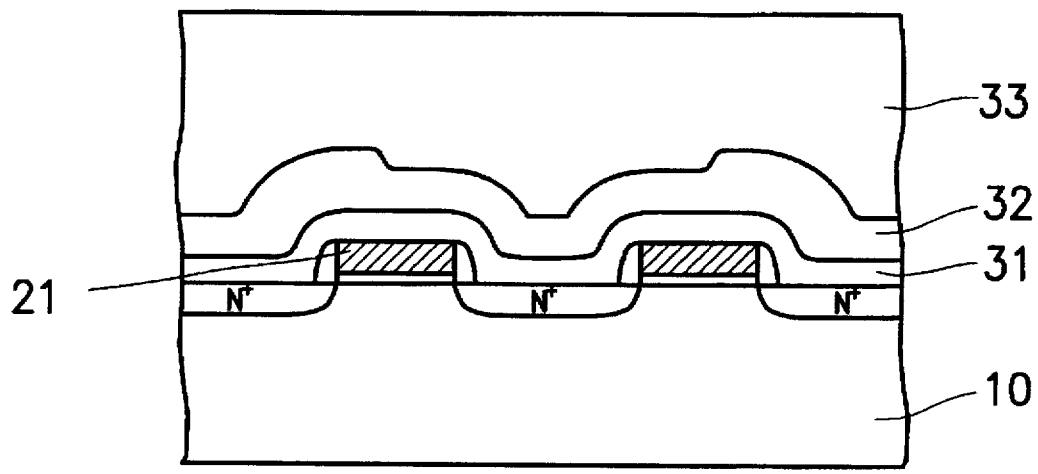
FIGS. 2A–2E are sectional schematic diagrams depicting the steps involved in a method according to the invention for forming a metal contact hole during semiconductor fabrication.

FIGS. 2A–2E are sectional schematic views depicting the steps involved in a method according to the invention for forming a metal contact hole during semiconductor fabrication. FIG. 2A shows a wafer that has been fabricated up to the stage previous to the formation of a metal contact hole. The wafer shown here is identical to that shown in FIG. 1A, which depicts a step of a conventional method, and therefore elements here are labeled with the same reference numerals as those in FIG. 1A. The construction shown includes a silicon substrate 10 formed with a plurality of $n^+$-type source/drain regions, a polysilicon layer 21, and oxide layers 31, 32, 33.

Figure 2B:
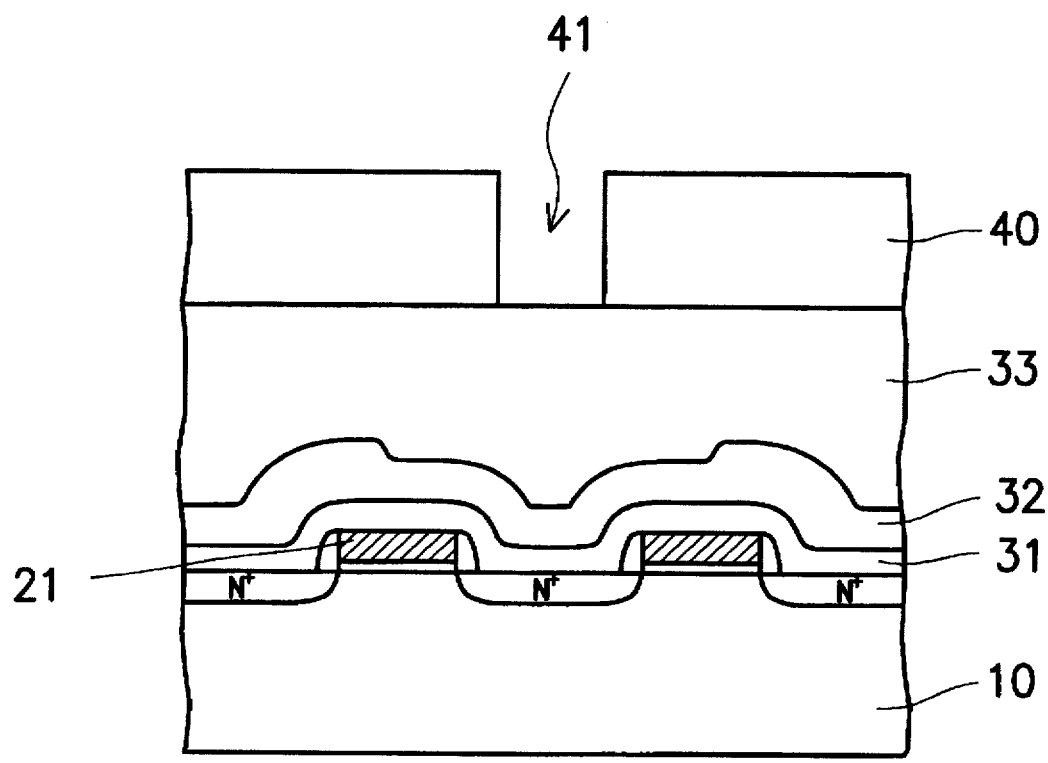

Referring next to FIG. 2B, preliminary to providing the metal contact hole, a photoresist layer 40 is coated over the oxide layer 33, or other dielectric layer. Then, a mask process and a photolithographic process are carried out on the wafer so as to form an opening 41 in the photoresist layer 40 at a position over where the metal contact hole is to be formed.

Figure 1C:
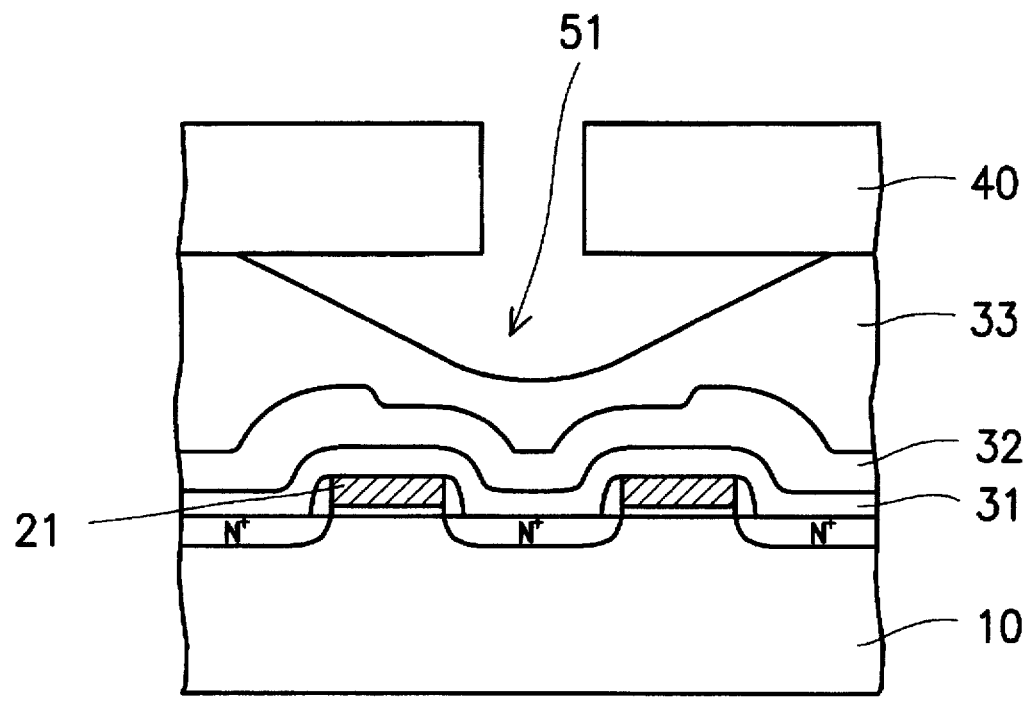
Figure 2C:
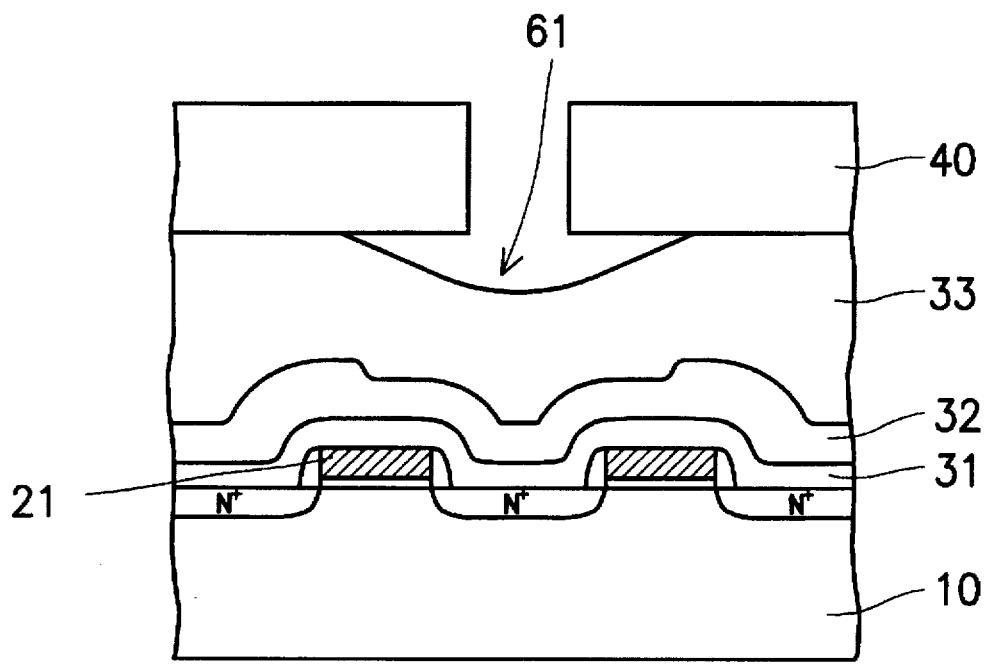

Referring next to FIG. 2C, in the subsequent step a wet etching process, for example a buffered oxide etching (BOE) process using a mixture of $NH_4F$ and HF as the buffered etchant, is performed on the oxide layer 31 through the opening 41. An unwanted part of the oxide layer 33 is thus etched away, thereby forming a first recess portion 61 in the oxide layer 33. In this process, the time required for the etching is short, so that the extent of the etching in the lateral direction can be easily controlled. The difference in etching control can be clearly seen by comparing the first recess portion 61 formed by the method of the invention to the upper recess portion 51 formed by the conventional method depicted in FIG. 1C.

Figure 2D:
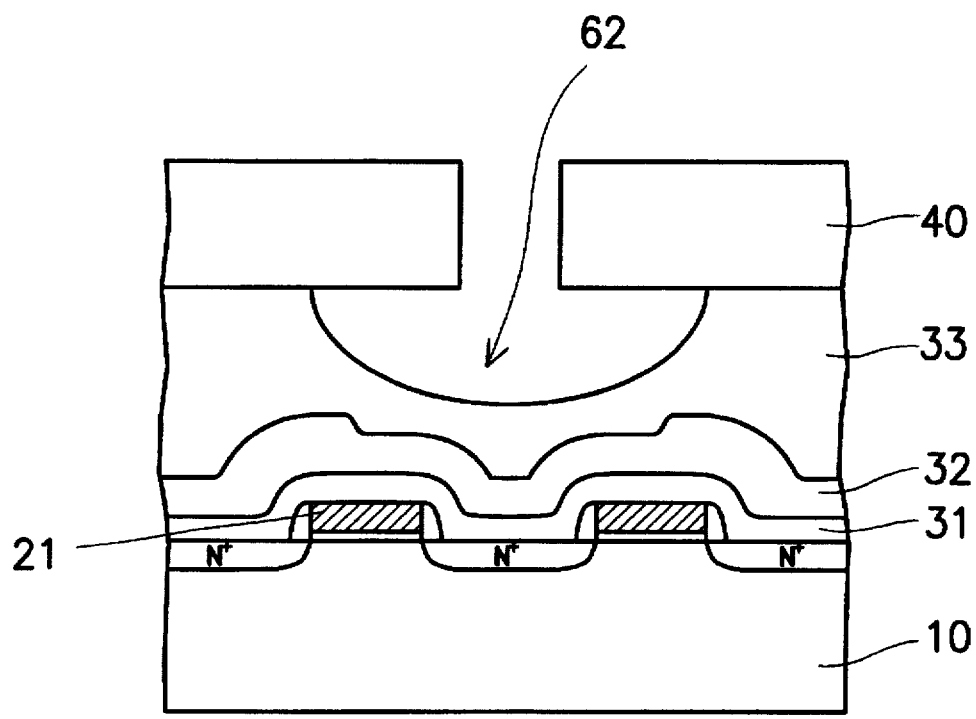

Referring next to FIG. 2D, in the subsequent step a dry isotropic etching process, for example a plasma etching process in a down-stream mode, is performed on the wafer so as to further extend the first recess portion 61 shown in FIG. 2C. As is well-known in the art, plasma etching in a down-stream mode occurs when diffusion of the plasma is directed from the plasma generator toward the wafer or substrate in the intended direction of the etching. The extended upper recess portion is hereinafter referred to as the second recess portion labeled with the reference numeral 62. The profile of the second recess portion 62 is shaped substantially like a bowl, with a slope greater than that of the upper recess portion 51 formed by the conventional method depicted in FIG. 1C. Since a dry etching process is employed, the lateral extent of the undercut portion beneath the photoresist layer 40 near the opening 41 is much less than that formed using the conventional method depicted in FIG. 1C.

Figure 2E:
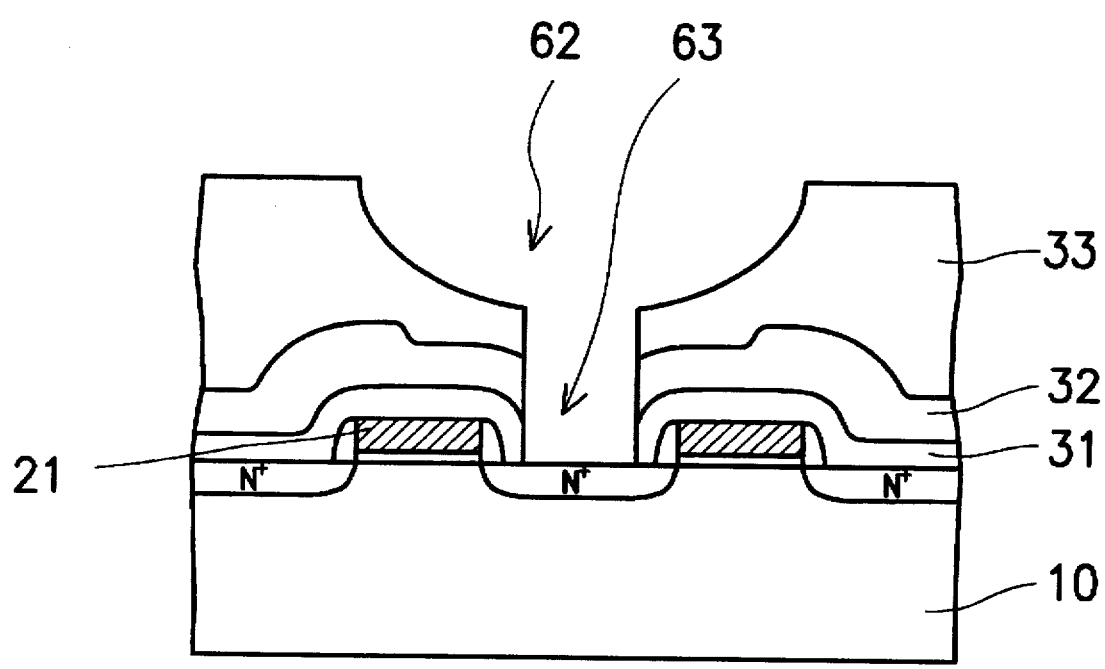

Referring next to FIG. 2E, subsequent to the dry isotropic etching process, a dry anisotropic etching process is performed through the opening 41 and the second recess portion 62 so as to further remove unwanted parts of the oxide layers 31, 32, 33. A third recess portion 63 is thus formed. The third recess portion 63 is shaped substantially like an upright cylindrical column that extends to the underlying $n^+$-type source/drain region. Since the dry etching process is anisotropic, the sidewall of the third recess portion 63 has a substantially upright profile. After that, the photoresist layer 40 is removed. The second recess portion 62 and the third recess portion 63 in combination constitute the desired metal contact hole.

Figure 1D:
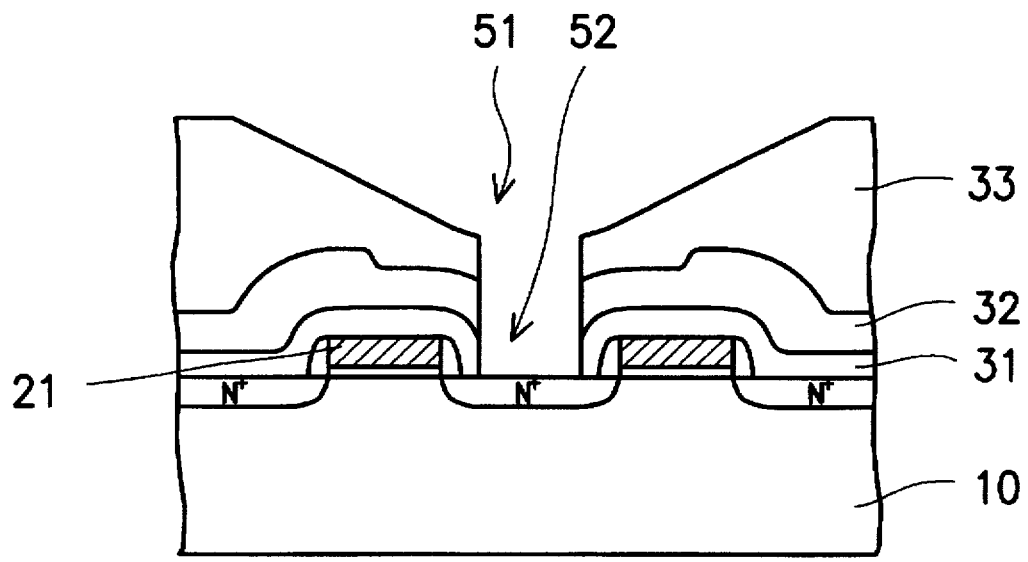

Comparing the second recess portion 62 shown in FIG. 2E with the upper recess portion 51 shown in FIG. 1D, an advantage that the invention provides over the conventional method is apparent, that is, the second recess portion 62 has an improved profile. This allows the metal subsequently deposited in the metal contact hole to provide an improved step coverage effect relative to metal deposited in a metal contact hole formed using the conventional method. As a result, the integrated circuit thus fabricated will have better reliability and a longer useful life.

Moreover, the invention has the advantage of providing greater control over the ratio of the extent of etching in the lateral direction to that in the downward direction. For example, the lateral extent of the first recess portion 61 shown in FIG. 2C and that of the second recess portion 62 can be controlled by controlling the time spent performing the wet isotropic etching process and the dry isotropic etching process.

The invention has been described with exemplary preferred embodiment. However, it is to be understood that the scope of the invention is not limited to the disclosed preferred embodiment. To the contrary, it is intended to cover various modifications and similar arrangements, which would be contemplated by those of ordinary skill in the art. The scope of the claims should be accorded the broadest interpretation, so as to encompass all such modifications and similar arrangements.

What is claimed is:

1. A method for forming at least a metal contact hole through at least a dielectric layer on a substrate, comprising the steps of:

(1) coating a photoresist layer over the dielectric layer and then forming an opening in the photoresist layer at a position over where the metal contact hole is to be formed;

(2) performing a wet isotropic etching process on the dielectric layer through the opening so as to form a first recess portion in the dielectric layer;

(3) performing a dry isotropic etching process on the dielectric layer through the opening and the first recess portion so as to extend the first recess portion, forming a second recess portion;

(4) conducting a dry anisotropic etching process on the dielectric layer through the opening and the second recess portion so as to form a third recess portion that extends from the bottom of the second recess portion to a surface of the substrate, wherein the second recess portion and the third recess portion in combination form the metal contact hole; and (5) removing the photoresist layer.

2. A method as claimed in claim 1, wherein in said step (2), a buffered etchant is used in the wet isotropic etching process.

3. A method as claimed in claim 1, wherein in said step (3), the dry isotropic etching process is a plasma etching process performed in a down-stream mode.

4. A method for forming at least a metal contact hole through at least a dielectric layer on a substrate, comprising the steps of:

(1) coating a photoresist layer over the dielectric layer and then forming an opening in the photoresist layer at a position over where the metal contact hole is to be formed;

(2) performing a wet isotropic etching process on the dielectric layer through the opening so as to form a first recess portion in the dielectric layer;

(3) performing a dry isotropic etching process on the dielectric layer through the opening and the first recess portion so as to extend the first recess portion, forming a second recess portion;

(4) performing a dry anisotropic etching process on the dielectric layer through the opening and the second recess portion so as to form a third recess portion beneath the second recess portion, wherein the second recess portion and the third recess portion in combination form the metal contact hole; and (5) removing the photoresist layer.

5. A method as claimed in claim 4, wherein in said step (2), the wet isotropic etching process is a buffered oxide etching process using a mixture of $NH_4F$ and HF as buffered etchant.

6. A method as claimed in claim 4, wherein in said step (3), the dry isotropic etching process is a plasma etching process performed in a down-stream mode.

7. A method as claimed in claim 4, wherein in said step (4), the dielectric layer is etched such that it extends from the bottom of the second recess portion to a surface of the substrate, wherein the third recess portion has a substantially upright sidewall.

8. A method for forming at least a metal contact hole through at least an oxide layer on a substrate, comprising the steps of:

(1) coating a photoresist layer over the oxide layer and then forming an opening in the oxide layer at a position over where the metal contact hole is to be formed;

(2) performing a wet isotropic etching process on the oxide layer through the opening so as to form a first recess portion in the oxide layer;

(3) performing a dry isotropic etching process on the dielectric layer through the opening and the first recess portion so as to extend the first recess portion, forming a second recess portion;

(4) performing a dry anisotropic etching process on the dielectric layer through the opening and the second recess portion so as to form a third recess portion beneath the second recess portion, wherein the second recess portion and the third recess portion in combination form the metal contact hole; and (5) removing the photoresist layer.

* * * * *